United States Patent
Doyle

(10) Patent No.: US 7,539,062 B2
(45) Date of Patent: May 26, 2009

(54) INTERLEAVED MEMORY PROGRAM AND VERIFY METHOD, DEVICE AND SYSTEM

(75) Inventor: Daniel H. Doyle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/642,334

(22) Filed: Dec. 20, 2006

(65) Prior Publication Data

US 2008/0151637 A1    Jun. 26, 2008

(51) Int. Cl.
*G11C 11/34* (2006.01)

(52) U.S. Cl. .............................. 365/185.22; 365/185.24

(58) Field of Classification Search ............ 365/185.22, 365/185.24
See application file for complete search history.

(56) References Cited

U.S. PATENT DOCUMENTS

| | | | | |
|---|---|---|---|---|
| 5,532,964 A * | 7/1996 | Cernea et al. | .......... | 365/189.09 |
| 5,574,684 A * | 11/1996 | Tomoeda | ................ | 365/185.04 |
| 5,666,323 A | 9/1997 | Zagar | | |
| 5,901,100 A * | 5/1999 | Taylor | ........................ | 365/219 |
| 6,178,129 B1 * | 1/2001 | Chen | .......................... | 365/206 |
| 6,215,705 B1 | 4/2001 | Al-Shamma | | |
| 6,456,542 B1 | 9/2002 | Roohparvar | | |
| 6,751,121 B2 | 6/2004 | Marotta | | |
| 6,917,543 B2 * | 7/2005 | Sato | ....................... | 365/185.22 |
| 6,920,522 B2 | 7/2005 | Roohparvar | | |
| 6,950,337 B2 * | 9/2005 | Bellini et al. | .......... | 365/185.13 |
| 7,006,382 B2 | 2/2006 | Pekny et al. | | |
| 7,073,016 B2 | 7/2006 | Zitlaw | | |
| 7,120,055 B2 | 10/2006 | Kessenich | | |
| 7,130,222 B1 | 10/2006 | Ho et al. | | |
| 2004/0156235 A1 * | 8/2004 | Bellini et al. | .......... | 365/185.13 |
| 2005/0185501 A1 * | 8/2005 | Lee et al. | ................ | 365/238.5 |
| 2006/0083097 A1 * | 4/2006 | Frulio et al. | ........... | 365/230.03 |
| 2006/0187716 A1 | 8/2006 | Roohparvar | | |
| 2006/0209592 A1 | 9/2006 | Li et al. | | |
| 2006/0227618 A1 | 10/2006 | Lee | | |
| 2006/0245270 A1 | 11/2006 | Louie et al. | | |
| 2006/0245272 A1 | 11/2006 | Hartono et al. | | |
| 2007/0011581 A1 | 1/2007 | Nakanishi et al. | | |
| 2007/0070704 A1 * | 3/2007 | Ho et al. | ................. | 365/185.22 |

OTHER PUBLICATIONS

International Search Report dated Apr. 21, 2008, for International Application No. PCT/US2007/088343 (3 pages).

* cited by examiner

*Primary Examiner*—Michael T Tran
(74) *Attorney, Agent, or Firm*—TraskBritt

(57) ABSTRACT

An interleaved memory programming and verification method, device and system includes a memory array including first and second memory banks of memory cells. The memory device further includes a controller configured to concurrently program a first data into the first memory bank and a second data into the second memory bank using iterative programming and verification operations in each of the first and second memory banks with the programming and verification operations in the second memory bank being offset from the programming and verification operations in the first memory bank.

14 Claims, 6 Drawing Sheets

| CYCLE | NON-INTERLEAVED 200 | | BANK INTERLEAVED 210 | |
|---|---|---|---|---|
| | BANK X | BANK Y | BANK A | BANK B |
| 1 | LATCH A1<br>PGM A1 | | LATCH A1<br>PGM A1 | |
| 2 | VER A1 | | VER A1 | LATCH B1<br>PGM B1 |
| 3 | PGM A1 | | PGM A1 | VER B1 |
| 4 | VER A1 | | VER A1 | PGM B1 |
| 5 | PGM A1 | | PGM A1 | VER B1 |
| 6 | VER A1 | | VER A1 | PGM B1 |
| 7 | | LATCH B1<br>PGM B1 | LATCH A2<br>PGM A2 | VER B1 |
| 8 | | VER B1 | VER A2 | LATCH B2<br>PGM B2 |
| 9 | | PGM B1 | PGM A2 | VER B2 |
| 10 | | VER B1 | VER A2 | PGM B2 |
| 11 | | PGM B1 | PGM A2 | VER B2 |
| 12 | | VER B1 | VER A2 | PGM B2 |
| 13 | LATCH A2<br>PGM A2 | | LATCH A3<br>PGM A3 | VER B2 |
| 14 | VER A2 | | VER A3 | LATCH B3<br>PGM B3 |
| 15 | PGM A2 | | PGM A3 | VER B3 |
| 16 | ⋮ | | ⋮ | ⋮ |
| 17 | ⋮ | | ⋮ | ⋮ |

FIG. 3

INTERLEAVED MEMORY PROGRAM AND VERIFY METHOD, DEVICE AND SYSTEM

FIELD OF THE INVENTION

The present invention, in various embodiments, relates generally to the field of semiconductor devices and more particularly, to programming of non-volatile memories.

BACKGROUND OF THE INVENTION

A non-volatile or flash memory device is a type of electrically erasable programmable read-only memory (EEPROM) and is used for non-volatile storage of data. Flash memory is being increasingly used to store execution codes and data in portable electronic products, such as computer systems, cameras, cellular telephones and other devices requiring non-volatile memory.

A conventional flash memory comprises a memory array having rows and columns of memory cells. Each of the memory cells is fabricated as a field-effect transistor having a control gate and a floating gate. The floating gate is capable of holding a charge and is separated by a thin oxide layer from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

Conventionally, the control gate of each memory cell of a row of the array is connected to a line (called a word-line) having a common voltage (word-line voltage), and the drain region of each memory cell of a column of the array is connected to a line (called a bit-line) having a common voltage (bit-line voltage). Flash memories currently have a typical operating voltage (Vcc) in the range of about 1.3 to 5 volts. A high voltage (or programming voltage), however, is usually required for programming and erase operations in a flash memory. This high voltage is often 8 volts or higher. During a programming operation, electrons may be injected onto the floating gate by applying the high voltage to the control gate, e.g., via the word-line, with the bit line being set to about Vcc-threshold voltage (Vt) for memory cells that are to be programmed to logic "0" and the bit line being set to ground for memory cells that are to be programmed to logic "1."

It is known that, during the programming of a row of the array, not all memory cells will accept or retain the initial programming. To determine if the memory cells in the row were properly programmed, a verify process reads the cells and compares the read values from the memory cells with the expected or originally programmed values. If one or more memory cells have not been properly programmed, the programming and verify steps are iteratively performed with the programming voltages incrementally increased.

While flash memories provide various advantages over other memory technologies, the successive program and verify cycles results in an undesirably lengthy programming process for storing data. Accordingly, there is a need for a method and system for reducing the overall programming latency associated with flash memory arrays.

BRIEF DESCRIPTION OF THE SEVERAL VIEWS OF THE DRAWINGS

The nature of the present invention as well as various embodiments of the present invention may be more clearly understood by reference to the following detailed description of the invention, to the appended claims, and to several drawings herein, wherein:

FIG. 3 illustrates a timing chart for programming and verification operations in a plurality of memory banks;

DETAILED DESCRIPTION OF THE INVENTION

Figure 1:
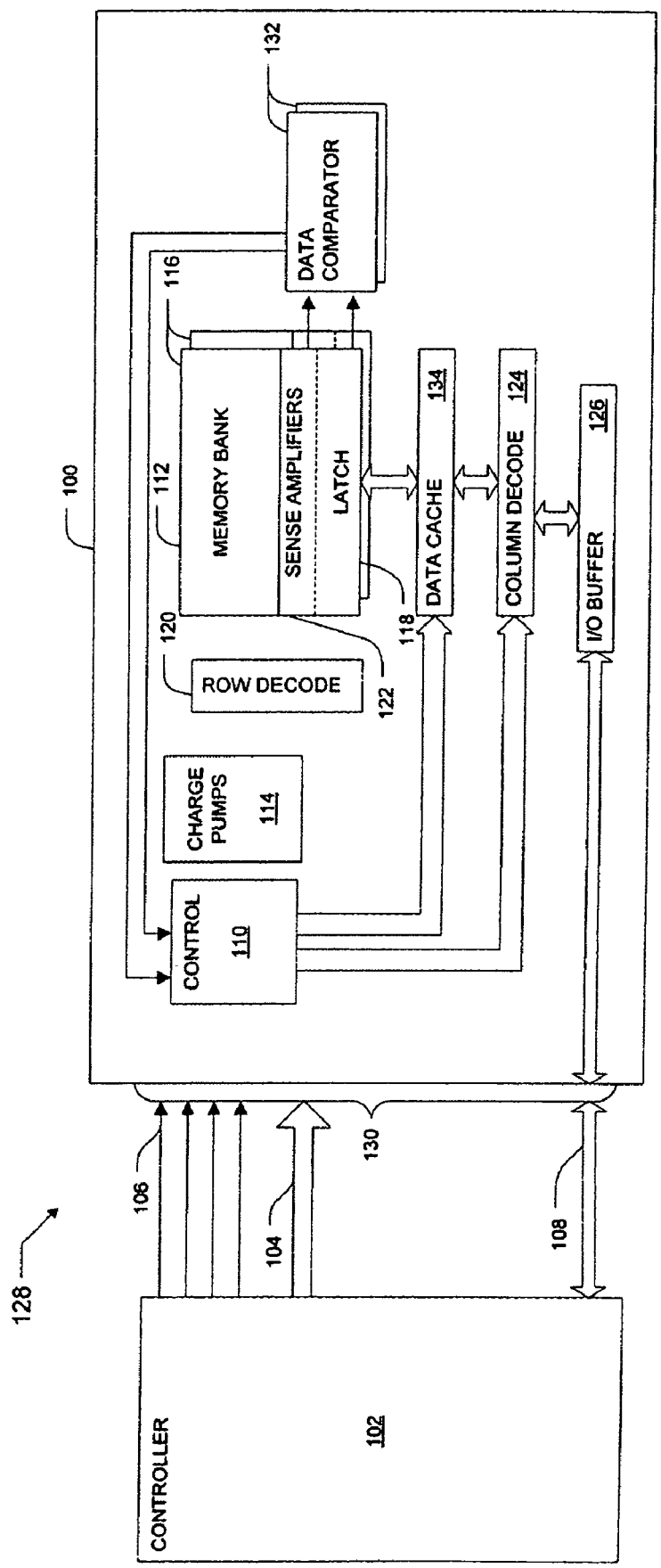
FIG. 1 is a block diagram of a memory system including a non-volatile memory device, in accordance with an embodiment of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

Non-volatile memory devices receive data to be stored therein. The storing or writing of data may require multiple program and verify cycles. In accordance with the various embodiments of the present invention, an array of memory cells is partitioned into operable banks of memory. The various banks of memory are programmed and verified in an interleaved manner accommodating program and verify cycles to be concurrently executing in the various banks of memory cells.

An interleaved memory programming and verification method, devices and system are disclosed herein. In one embodiment of the present invention, a memory device includes a memory array including at least a first memory bank and a second memory bank of memory cells. A controller is configured to program first and second data into the memory array by concurrently programming the first data into one of the first and second memory banks and verifying the second data in the other one of the first and second memory banks.

In another embodiment of the present invention, a non-volatile memory is disclosed and includes first and second memory banks and a controller. The controller is configured to concurrently program a first data into the first memory bank and a second data into the second memory bank using iterative programming and verification operations in each of the first and second memory banks. The programming and verification operations in the second memory bank are offset from the programming and verification operations in the first memory bank.

A further embodiment of the present invention provides a memory system including a memory controller coupled to a memory device. The memory device includes first and second memory banks and the controller concurrently programs a first data into the first memory bank and a second data into the second memory bank using iterative programming and verification operations in each of the first and second memory banks. The programming and verification operations in the second memory bank are offset from the programming and verification operations in the first memory bank.

In another embodiment of the present invention, an electronic system includes at least one input/output device and a memory device. The memory device includes first and second memory banks and a controller configured to concurrently program a first data into the first memory bank and a second data into the second memory bank using iterative programming and verification operations in each of the first and second memory banks. The programming and verification operations in the second memory bank are offset from the programming and verification operations in the first memory bank.

A method of programming a non-volatile memory array is disclosed in a further embodiment of the present invention and includes iteratively programming and verifying a first data in a first memory bank of the non-volatile memory array. The method further includes concurrently iteratively programming and verifying a second data in a second memory bank of the non-volatile memory array offset from the iteratively programming and verifying in the first memory bank.

In yet a further embodiment of the present invention, a method of writing data to a memory array is provided and includes storing a first data in first sense amplifiers of a first memory bank of the memory array and storing a second data in second sense amplifiers of a second memory bank of the memory array. The method further includes concurrently alternating programming and verifying the first data in the first memory bank and the second data in the second memory bank.

Many of the internal operations of volatile memories, flash memories and other types of non-volatile memories require that the memory perform data comparisons. Typically this data comparison, also known as "verify," is performed in the context of comparing data that has been read from the memory array with the data that was expected to be written into the memory array in order to find any errors that would require a successive programming step.

With the large data storage density of modern memory devices, it is not unusual for each row/page of the memory array to have 16 kilobits of individual data values each, and each memory array to contain multiple gigabits of data storage, particularly in non-volatile memory devices. These increasingly larger data sizes make the serial read out and comparison of data prohibitive in general memory operation.

As stated, in a programming operation of a page/row of the memory array, after the data is programmed to the array, it is typically immediately read again from memory array so that the data can be verified. In this verification operation, the data that was programmed in the memory array is compared with the original data typically still being held in a latch to discover any errors and ensure it was properly programmed. If an error is discovered, the programming operation is performed again with an increased programming voltage followed by a subsequent verify process. Such an iterative process may continue for a fixed number of cycles before either the page or block is tagged as defective and the data move to another location. It is noted that, in some cases, if data that fails verification in a programming operation but has errors that are correctable utilizing the ECC code, it can be allowed to remain in the original location of the non-volatile memory and the ECC code relied upon to correct the error when the location is accessed.

FIG. 1 illustrates a simplified diagram of a memory system 128 including a controller 102 and a non-volatile memory device 100, in accordance with an embodiment of the present invention. Controller 102 may be configured as a conventional processing device such as a memory controller. The non-volatile memory 100 may be configured as a NOR architecture flash memory device or as a NAND architecture flash memory device. It is noted that non-volatile memory device 100 may also be configured as other non-volatile memory arrays 112 of differing technology and architecture types, including, but not limited to, Polymer memory, FeRAM, OUM, MRAM, Molecular memory, and Carbon Nanotube memory as well as others known by those of ordinary skill in the art.

Non-volatile memory device 100 further comprises an interface 130 including an address interface 104, control interface 106, and data interface 108 that are each coupled to the controller 102 to allow memory read and write accesses. It is noted that other memory interfaces 130 may be similarly configured such as a combined address/data bus configurations as well as other arrangements known by those of ordinary skill in the art. In one embodiment of the present invention, the interface 130 is a synchronous memory interface, such as an SDRAM or DDR-SDRAM interface. Non-volatile memory device 100 further includes an internal memory controller 110 configured to direct the internal operation and specifically configured to manage an interleaved programming and verification process of the various banks of memory array 112. The non-volatile memory array 112 contains a sequence of memory banks 116. Memory access addresses are received on the address interface 104 of the non-volatile memory device 100 and divided into a row and column address portions. While the various embodiments described herein specifically illustrate two individual banks of memory cells, other pluralities of memory banks are also contemplated within the scope of the present invention.

During a programming and verification process controlled by controller 110, the row decode circuit 120 selects the row page and column decode circuit 124 selects write sense amplifiers 122. Data values to be written are coupled from the I/O buffer 126 via the internal data bus to the data cache 134 and the write sense amplifiers 122 selected by the column decode circuit 124. The data is then written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells.

More specifically in the memory array, each of the memory cells is fabricated as a field-effect transistor having a control gate and a floating gate. The floating gate is capable of holding a charge and is separated by a thin oxide layer from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

During a programming operation, the control gate of each memory cell of a row of the array is connected to a line (called a word-line) having a common voltage (word-line voltage), and the drain region of each memory cell of a column of the array is connected to a line (called a bit-line) having a common voltage (bit-line voltage). Flash memories may have a typical operating voltage (Vcc) in the range of about 1.3 to 5 volts. A high voltage (or programming voltage) from a high voltage charge pump 114, however, is usually required for program and erase operations in a flash memory. The high voltage is often 8 volts or higher. During the programming operation, electrons may be injected onto the floating gate by applying the high voltage to the control gate, e.g., via the word-line, with the bit line being set to about Vcc-threshold voltage (Vt) for memory cells that are to be programmed to logic "0" and the bit line being set to ground for memory cells that are to be programmed to logic "1." Other mechanisms for adding or removing charge from the floating gate are also known.

During a verification operation, the row address is latched and decoded by row decode circuit 120, which selects and activates a row/page (not shown) of memory cells across a selected memory bank. The voltage at the control gate (word-line voltage) of the flash memory cell is pumped-up to a program-verify or read voltage, e.g., at or slightly above a threshold voltage (Vt) of an erased cell, using the high voltage charge pump 114. When the word-line voltage reaches the program-verify voltage, a program-verify is performed to determine if the memory cell is programmed. This usually involves sensing a current of the cell.

The bit values encoded in the output of the selected row of memory cells are coupled to a local bitline (not shown) and a global bitline (not shown) and are detected by sense amplifiers 122 associated with the memory bank. For example, if the cell current is above a reference value, indicating that the Vt of the cell is below that of a programmed cell, the cell is not programmed. If the cell current is below the reference value, indicating that the Vt of the cell is above that of an erased cell, the cell is programmed.

If the cell is not programmed, the process enters an iterative or another programming cycle, and the charge pump pumps the word-line voltage from the program-verify voltage to the programming voltage, while another charge pump pumps the voltage at the drain region (bit-line voltage) from about zero to about half the word-line voltage, initiating programming of the cell.

In one embodiment of the present invention, the non-volatile memory device 100 contains a data comparator 132 coupled between the latch 118 and the sense amplifiers 122 to allow data comparison between the data to be programmed into the page of memory as retained in latch 118 and the sensed or read data as determined by sense amplifiers 122 during a verification process. In the various embodiments of the present invention, the data comparator 132 is integrated into the sense amplifiers 122.

The data comparator 132 is utilized during a programming operation of a page/row of the memory array 112 of the memory device 100 of FIG. 1. As stated above, after the data is programmed into the memory array 112, the data is subsequently read again from the memory array 112 by the sense amplifiers 122 so that the data can be verified. In this verification operation, the data that was programmed into the memory array 112 is compared with the original data that is still being held in the latch 118 to discover any errors and ensure the data was properly programmed.

It is noted that other architectures of non-volatile memory devices, systems, external interfaces, and/or configurations of coupling the memory controller/host to the non-volatile memory device(s), such as multiple memory devices with global/local control busses and signal lines, are possible and will be apparent to those of ordinary skill in the art.

Figure 2:
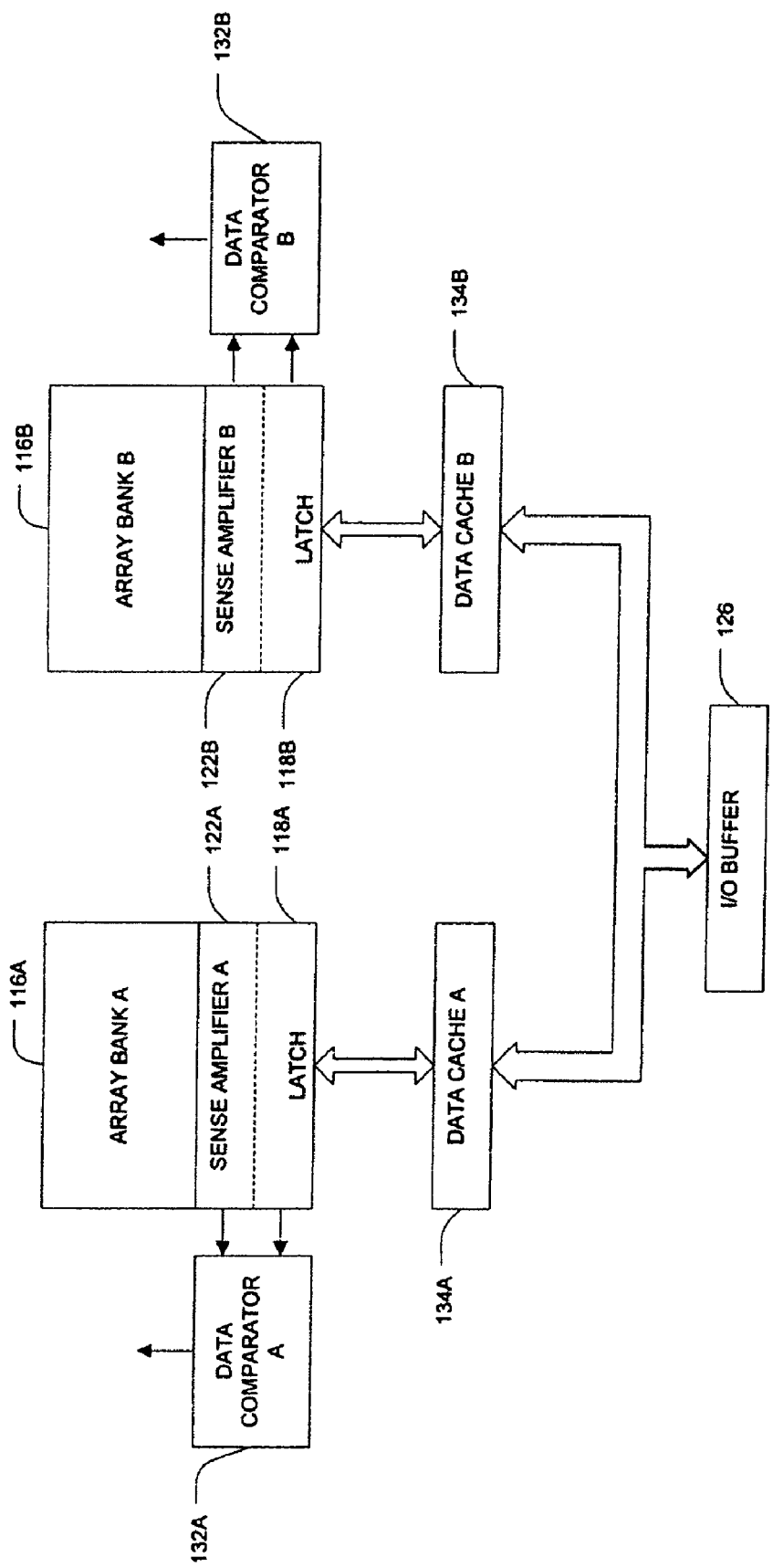
FIG. 2 is a block diagram of a portion of a memory device, in accordance with an embodiment of the present invention.

FIG. 2 is a block diagram of a portion of a memory device, in accordance with an embodiment of the present invention. The present embodiment illustrates a memory array 112 partitioned into two memory banks, memory bank A 116A and memory bank B 116B. During the programming and verification operations of the present embodiment illustrated in FIG. 3, data (e.g., data A1) is received at I/O buffer 126 for programming into memory bank A 116A. Data A1 is buffered into data cache A 134A for ready availability for programming into memory bank A 116A when any previously initiated programming and verification operations conclude. Also, buffering of data A1 in data cache A 134A also releases the I/O buffer 126 to receive a subsequent data (e.g., data B1).

As stated, the programming of memory cells involves a plurality of iterations of programming and verification operations. Prior to the initial programming operation in memory bank A 116A, data A1 from data cache A 134A is transferred to latch A 118A of sense amplifier A 122A. An initial programming operation to program data A1 from latch A 118A into memory bank A 116A occurs according to the programming conditions described above with reference to FIG. 1. Subsequently, an initial verification operation reads data A1', as sensed by sense amplifier A 122A, from memory bank A 116A and compares the sensed data A1' (not shown) in data comparator A 132A with the data A1 stored in latch A 118A. If the data A1 was successfully programmed into memory bank A 116A, then additional programming and verification operation iterations are unnecessary. Consequently, no-operation (NOP) commands may be performed as timing placeholders to maintain an offset synchronization with the programming and verification operations of memory bank B 116B.

Concurrent with the initial verification operation in memory bank A 116A, an initial programming operation to program data B1 from latch B 118B into memory bank B 116B occurs. Prior to the initial programming operation in memory bank B 116B, data B1 from data cache B 134B is transferred to latch B 118B of sense amplifier B 122B. The initial programming operation to program data B1 from latch B 118B into memory bank B 116B then occurs according to the programming conditions described above with reference to FIG. 1. Subsequently, an initial verification operation reads data B1' (not shown), as sensed by sense amplifier B 122B, from memory bank B 116B and compares the sensed data B1' in data comparator B 132B with the data B1 stored in latch B 118B. If the data B1 was successfully programmed into memory bank B 116B, then additional programming and verification iterations are unnecessary. Consequently, no-operation (NOP) commands may be performed as timing placeholders to maintain an offset synchronization with the programming and verification operations of memory bank A 116A.

The programming and verification operations in memory bank A 116A and memory bank B 116B continue with the programming and verification operations concurrently alternating between memory bank A 116A and memory bank B 116B. Alternating the programming operation between banks enables concurrent iterative programming and verification operations in multiple memory banks thereby reducing the overall number of programming and verification cycles required to program a memory array with a plurality of data. Furthermore, alternating the programming operation between memory banks distributes the power demands required of the high voltage charge pumps 114 during the programming operation.

FIG. 3 illustrates a timing chart of programming and verification operations in a plurality of memory banks. In FIG. 3, timing sequence 200 illustrates a non-interleaved conventional sequential programming and verification operation where an individual memory bank (e.g., memory bank X) is iteratively programmed and verified (cycles 1-6) before another memory bank (e.g., memory bank Y) is subsequently iteratively programmed and verified (cycles 7-12).

In accordance with an embodiment of the present invention, timing sequence 210 of FIG. 3 illustrates a timing chart of interleaved programming and verification operations, in accordance with an embodiment of the present invention. Timing sequence 210 illustrates interleaved programming and verification operations for a plurality of memory banks (e.g., memory bank A and memory bank B). As illustrated, data A1 is iteratively programmed and verified in memory bank A during cycles 1-6 while data B1 is iteratively programmed and verified in memory bank B during cycles 2-7 which are offset from the programming and verification of operations in memory bank A. Subsequently, data A2 is iteratively programmed and verified in memory bank A during cycles 7-12 while data B2 is iteratively programmed and verified in memory bank B during cycles 8-13 which are offset from the programming and verification operations in memory bank A. Such alternating concurrent programming and verification operations may continue until a desired amount of data has been programmed into memory array 112 (FIG. 1). It should be noted that the initial programming operation for each data includes a latching step (e.g., cycle 1 for data A1, cycle 2 for data B2, cycle 7 for data A2, cycle 8 for data B2, etc.) for initially latching the data into the respective latch 118 of sense amplifier 122.

By way of comparison between the conventional timing sequence 200 and timing sequence 210 in accordance with one or more embodiments of the present invention, the programming of 10 pages of data, for example, using conventional sequential programming and verification operations according to timing sequence 200 would require 60 representative cycles to complete while the alternating concurrent programming and verification operations according to timing sequence 210 of the various embodiments of the present invention accomplish the same programming of 10 pages using only 31 representative cycles. Such an improvement illustrates essentially a doubling of the programming and verification bandwidth. If it is assumed that the programming time (PGM) is roughly equivalent to the verification time (VER), then the programming and verification bandwidth is essentially doubled. Even assuming that the programming time (PGM) is twice the duration of the verification time, then the programming and verification bandwidth gain is (PGM+VER)/PGM=3/2 times the conventional programming and verification bandwidth.

Figure 4:
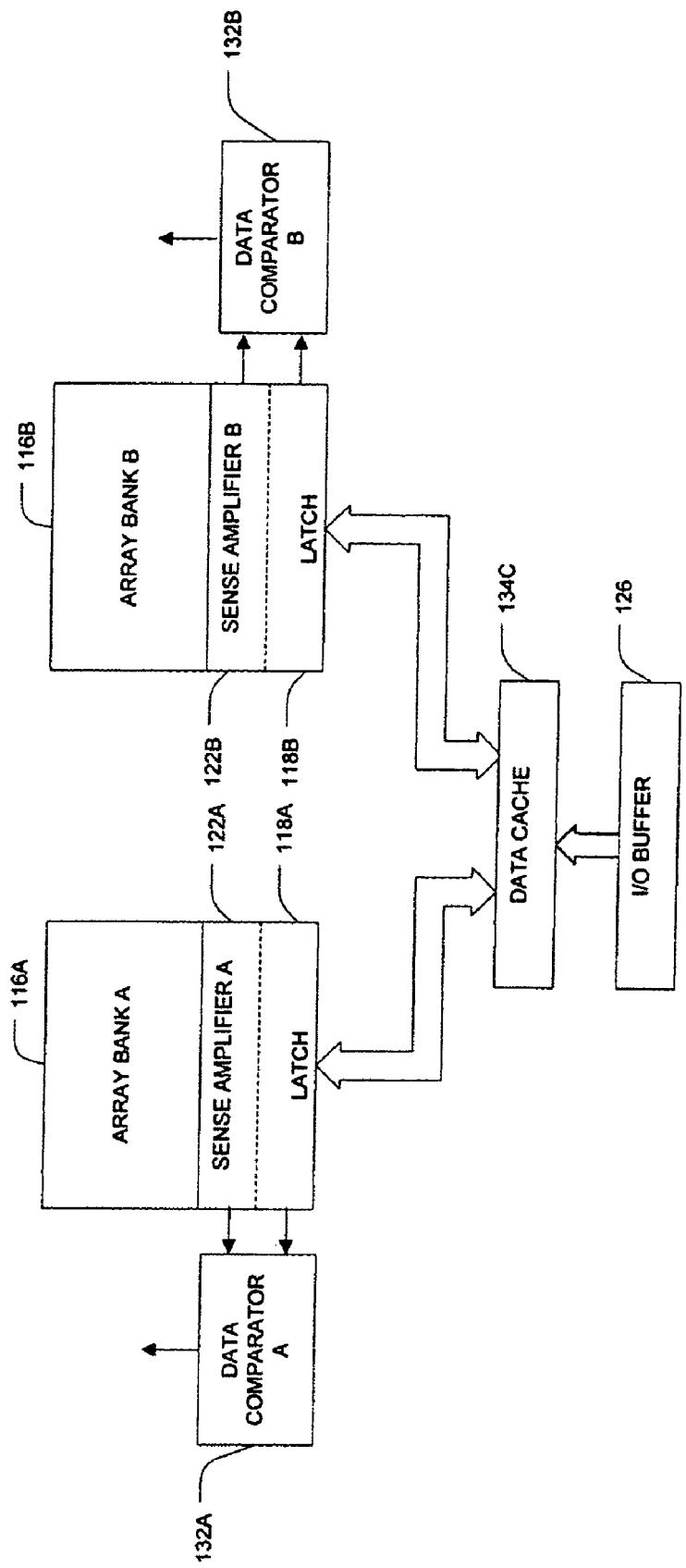
FIG. 4 is a block diagram of a portion of a memory device, in accordance with another embodiment of the present invention.

FIG. 4 is a block diagram of a portion of a memory device, in accordance with another embodiment of the present invention. The present embodiment illustrates a memory array 112 partitioned into two memory banks, memory bank A 116A and memory bank B 116B that utilize a shared data cache 134C for loading each of the respective latches 118A, 118B of sense amplifiers 122A, 122B during the initial programming operation. It is known that data caches require a significant amount of area on an integrated circuit for implementation. While utilizing an architecture including a shared data cache 134C results in a decrease in overall programming and verification bandwidth, the latching of data as illustrated in FIG. 3 (e.g., data A1, data B1, etc.) for different memory banks from the I/O buffer 126 in offsetting cycles partially conceals the overall impact.

During the programming and verification operations of the present embodiment, data (e.g. data A1) is received at I/O buffer 126 for programming into memory bank A 116A. Data A1 is buffered into shared data cache 134C for ready availability for programming into memory bank A 116A when any previously initiated programming and verification operation concludes. While buffering data A1 in shared data cache 134C releases the I/O buffer 126 to receive a subsequent data (e.g., data B1), a bottleneck occurs since there is no other data cache for storing subsequent data. Therefore, shared data cache 134C must be emptied into sense amplifier latch A 118A before data (e.g., data B1) may be passed from I/O buffer 126.

As stated, the programming of memory cells involves an iteration of programming and verification operations. Prior to the initial programming operation in memory bank A 116A, data A1 from shared data cache 134C is transferred to latch A 118A of sense amplifier A 122A. An initial programming operation occurs to program data A1 from latch A 118A into memory bank A 116A according to the programming conditions described above with reference to FIG. 1. Subsequently, an initial verification operation reads data A1', as sensed by sense amplifier A 122A, from memory bank A 116A and compares in data comparator A 132A data A1' with the data A1 stored in latch A 118A. If the data A1 was successfully programmed into memory bank A 116A, then additional programming and verification operation iterations are unnecessary. Consequently, no-operation (NOP) commands may be performed as timing placeholders to maintain an offset synchronization with the programming and verification operations of memory bank B 116B.

Concurrent with the initial verification operation in memory bank A 116A, an initial programming operation to program data B1 from latch B 118B into memory bank B 116B occurs. Prior to the initial programming operation in memory bank B 116B, data B1 from shared data cache 134C is transferred to latch B 118B of sense amplifier B 122B. The initial programming operation to program data B1 from latch B 118B into memory bank B 116B then occurs according to the programming conditions described above with reference to FIG. 1. Subsequently, an initial verification operation reads data B1', as sensed by sense amplifier B 122B, from memory bank B 116B and compares sensed data B1' in data comparator B 132B with the data B1 stored in latch B 118B. If the data B1 was successfully programmed into memory bank B 116B, then additional programming and verification iterations are unnecessary. Consequently, no-operation (NOP) commands may be performed as timing placeholders to maintain an offset synchronization with the programming and verification operations of memory bank A 116A. The programming and verification operations in memory bank A 116A and memory bank B 116B continue with the programming operation and verification operation concurrently alternating between memory bank A 116A and memory bank B 116B.

Figure 5:
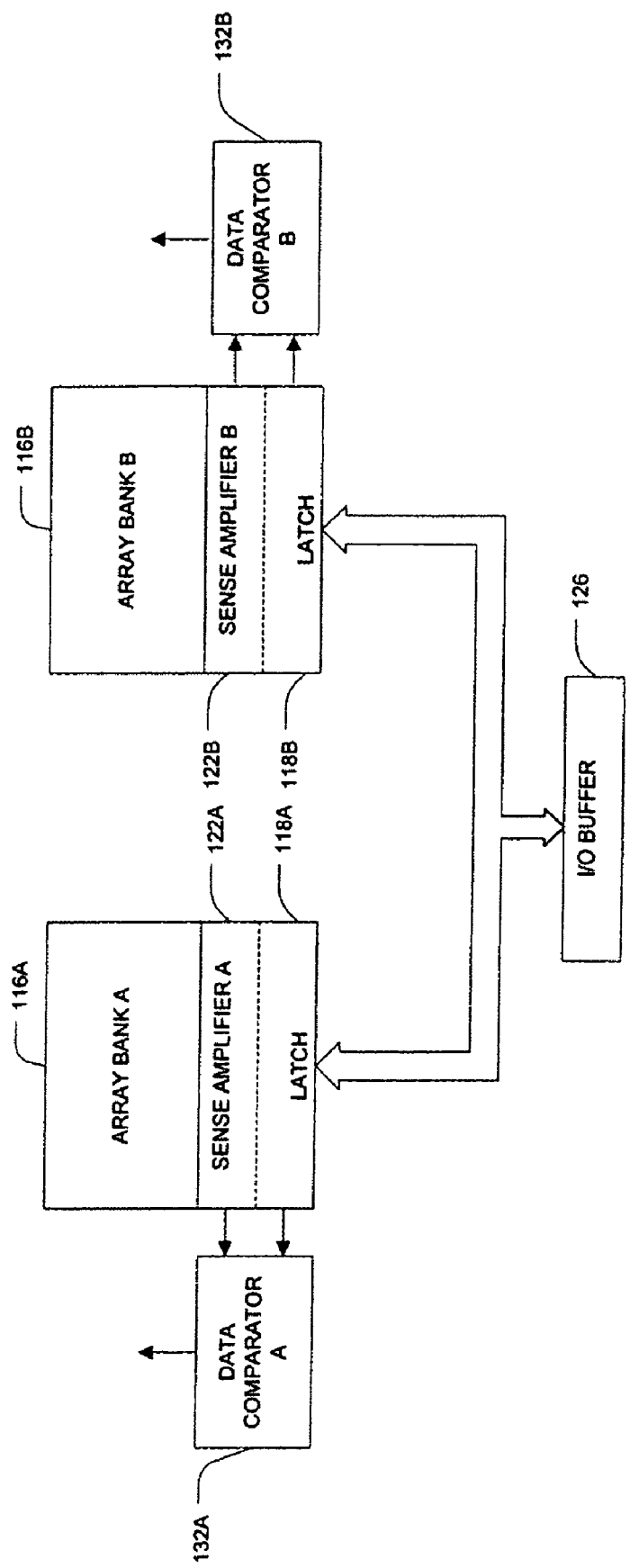
FIG. 5 is a block diagram of a portion of a memory device, in accordance with a further embodiment of the present invention.

FIG. 5 is a block diagram of a portion of a memory device, in accordance with a further embodiment of the present invention. The present embodiment illustrates a memory array 112 partitioned into two memory banks, memory bank A 116A and memory bank B 116B. In the present embodiment, the memory device does not utilize a data cache but directly loads data from the I/O buffer 126 directly into each of the respective latches 118A, 118B of sense amplifiers 122A, 122B during the initial programming operation. It is known that data caches require a significant amount of area on an integrated circuit for implementation. Therefore, an architecture that does not include a data cache results in a multiple bank programming and verification architecture requiring less area for implementation of the integrated circuit. While such an architecture may result in a decrease in overall programming and verification bandwidth, the latching of data (e.g., data A1, data B1, etc.) for different memory banks from the I/O buffer 126 in offsetting cycles partially conceals the overall impact.

During the programming and verification operations of the present embodiment, data (e.g. data A1) is received at I/O buffer 126 for programming into memory bank A 116A. Data A1 is transferred directly into latch A 118A of sense amplifier A 122A for the commencement of the iterative programming and verification operations of memory bank A 116A. As stated, the programming of memory cells involves an iteration of programming and verification operations. An initial programming operation occurs to program data A1 from latch A 118A into memory bank A 116A according to the programming conditions described above with reference to FIG. 1. Subsequently, an initial verification operation reads data A1', as sensed by sense amplifier A 122A, from memory bank A 116A and compares sensed data A1' in data comparator A 132A with the data A1 stored in latch A 118A. If the data A1 was successfully programmed into memory bank A 116A, then additional programming and verification operation iterations are unnecessary. Consequently, no-operation (NOP) commands may be performed as timing placeholders to maintain an offset synchronization with the programming and verification operations of memory bank B 116B.

Concurrent with the initial verification operation in memory bank A 116A, an initial programming operation to program data B1 from latch B 118B into memory bank B 116B occurs. Prior to the initial programming operation in memory bank B 116B, data B1 from I/O buffer 126 is transferred to latch B 118B of sense amplifier B 122B. The initial programming operation to program data B1 from latch B 118B into memory bank B 116B then occurs according to the programming conditions described above with reference to FIG. 1. Subsequently, an initial verification operation reads data B1', as sensed by sense amplifier B 122B, from memory bank B 116B and compares sensed data B1' in data comparator B 132B with the data B1 stored in latch B 118B. If the data B1 was successfully programmed into memory bank B 116B, then additional programming and verification operation iterations are unnecessary. Consequently, no-operation (NOP) commands may be performed as timing placeholders to maintain an offset synchronization with the programming and verification operations of memory bank A 116A. The programming and verification operations in memory bank A 116A and memory bank B 116B continue with the programming operation and verification operations concurrently alternating between memory bank A 116A and memory bank B 116B.

Figure 6:
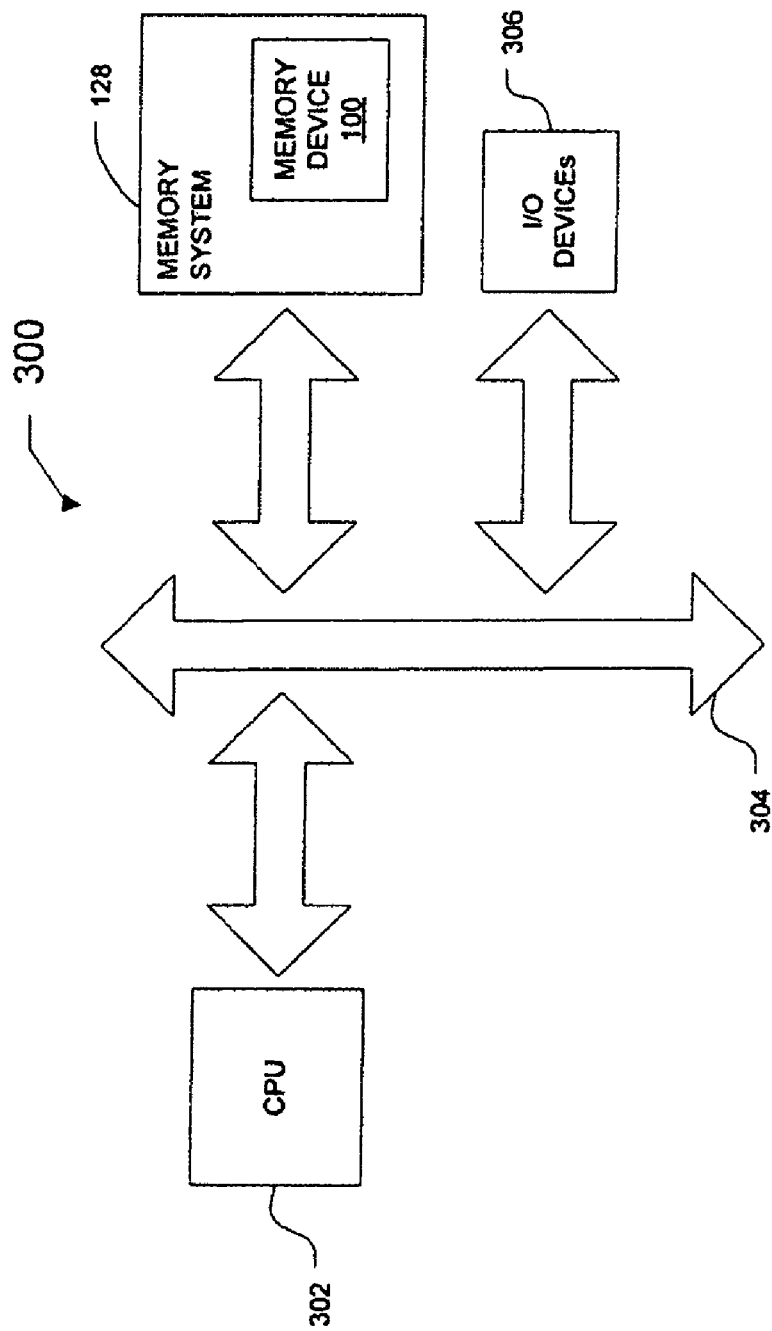
FIG. 6 is a system diagram of an electronic system including a memory system, in accordance with an embodiment of the present invention.

FIG. 6 is a system diagram of an electronic system including a memory system, in accordance with an embodiment of the present invention. An electronic system 300 includes a memory system 128 illustrated in FIG. 1 as a controller 102 and memory device 100. Examples of electronic systems, which may employ memory device 100, include, without limitation, computer systems, audio and video systems such as cellular telephones, personal digital assistants, MP3 players, digital cameras, and others. An electronic system 300 includes a central processing unit (CPU) 302 that communicates with various devices over a bus 304. Some of the devices connected to the bus 304 provide communication in to and out of the electronic system 300, illustratively including input/output (I/O) devices 306 and memory system 128.

The processes and devices described above illustrate exemplary methods and devices out of many that may be used and produced according to the present invention. The above description and drawings illustrate embodiments which provide significant features and advantages of the present invention. It is not intended, however, that the present invention be strictly limited to the above-described and illustrated embodiments.

Although the present invention has been shown and described with reference to particular embodiments, various additions, deletions and modifications that will be apparent to a person of ordinary skill in the art to which the invention pertains, even if not shown or specifically described herein, are deemed to lie within the scope of the invention as encompassed by the following claims.

What is claimed is:

1. A memory device, comprising:
a memory array including a first memory bank and a second memory bank of memory cells;
a controller configured to program a first and second data into the memory array by concurrently programming the first data into one of the first and second memory banks and verifying the second data in the other one of the first and second memory banks, wherein the first and second data are interleaved;
an I/O buffer configured to receive the first and second data for programming into the respective first and second memory banks; and
a shared data cache configured to cache the first data from the I/O buffer until the first memory bank is readied to program the first data therein and further configured to subsequently cache the second data from the I/O buffer until the second memory bank is readied to program the second data therein.

2. A memory device, comprising:
a memory array including a first memory bank and a second memory bank of memory cells;
a controller configured to program a first and second data into the memory array by concurrently programming the first data into one of the first and second memory banks and verifying the second data in the other one of the first and second memory banks, wherein the first and second data are interleaved;
an I/O buffer configured to receive the first and second data for programming into the respective first and second memory banks;
a first data cache configured to cache the first data from the I/O buffer until the first memory bank is readied to program the first data therein; and
a second data cache configured to cache the second data from the I/O buffer until the second memory bank is readied to program the second data therein.

3. A memory device, comprising:
a memory array including a first memory bank and a second memory bank of memory cells;
a controller configured to program a first and second data into the memory array by concurrently programming the first data into one of the first and second memory banks and verifying the second data in the other one of the first and second memory banks, wherein the first and second data are interleaved; and
first and second sense amplifiers respectively operatively coupled with the first and second memory banks, the first and second sense amplifiers each including a latch to respectively store the first and second data during iterative programming and verification operations in the first and second memory banks.

4. The memory device of claim 3, further comprising first and second comparators configured to respectively verify the first and second data with first and second sensed data sensed by the first and second sense amplifiers during the verification operation.

5. The memory device of claim 4, wherein the controller is further configured to repeatedly perform a subsequent programming and verification operation on at least one of the first and second memory banks when the respective first and second data do not match the first and second sensed data.

6. The memory device of claim 3, wherein the first and second sense amplifiers are further configured to latch the first and second data directly from an external interface of the memory device.

7. The memory device of claim 3, further comprising a shared data cache and wherein the first and second sense amplifiers are further configured to latch the first and second data from the shared data cache.

8. The memory device of claim 3, further comprising first and second data caches and wherein the first and second sense amplifiers are further configured to respectively latch the first and second data from the first and second data caches.

9. A non-volatile memory device, comprising:
first and second memory banks;
a controller configured to concurrently program a first data into the first memory bank and a second data into the second memory bank using iterative programming and verification operations in each of the first and second memory banks with the programming and verification operations in the second memory bank being offset from the programming and verification operations in the first memory bank, wherein the first and second data are interleaved; and
a shared data cache configured to cache the first data received from an external interface of the non-volatile memory device until commencement of the programming and verification operations of the first memory bank and further configured to cache the second data received from an external interface of the non-volatile memory device until commencement of the programming and verification operations of the second memory bank.

10. A non-volatile memory device, comprising:
first and second memory banks;
a controller configured to concurrently program a first data into the first memory bank and a second data into the second memory bank using iterative programming and verification operations in each of the first and second memory banks with the programming and verification operations in the second memory bank being offset from the programming and verification operations in the first memory bank, wherein the first and second data are interleaved; and
a first data cache configured to cache the first data received from an external interface of the non-volatile memory device until commencement of the programming and verification operations of the first memory bank and a second data cache configured to cache the second data received from an external interface of the non-volatile memory device until commencement of the programming and verification operations of the second memory bank.

11. A method of programming a non-volatile memory array, comprising:
iteratively programming and verifying a first data in a first memory bank of the non-volatile memory array;
caching the first and second data in a shared cache configured to cache the first data until commencement of the iteratively programming and verifying of the first data and further configured to cache the second data until commencement of concurrently iteratively programming and verifying of the second data; and
concurrently iteratively programming and verifying a second data in a second memory bank of the non-volatile memory array offset from the iteratively programming and verifying in the first memory bank, wherein the first and second data are interleaved.

12. A method of programming a non-volatile memory array, comprising:
iteratively programming and verifying a first data in a first memory bank of the non-volatile memory array;
concurrently iteratively programming and verifying a second data in a second memory bank of the non-volatile memory array offset from the iteratively programming and verifying in the first memory bank, wherein the first and second data are interleaved;
caching in a first data cache configured to cache the first data until commencement of the iteratively programming and verifying of the first data; and
caching in a second data cache configured to cache the second data until commencement of the concurrently iteratively programming and verifying of the second data.

13. A method of writing data to a memory array, comprising:
storing a first data in first sense amplifiers of a first memory bank of the memory array;
storing a second data in second sense amplifiers of a second memory bank of the memory array;
concurrently alternating programming and verifying the first data in the first memory bank and the second data in the second memory bank, wherein the first and second data are interleaved; and
caching the first data in a shared cache configured to cache the first data until commencement of the concurrently alternating programming and verifying the first data in the first memory bank and caching the second data until commencement of the concurrently alternating programming and verifying the second data in the second memory bank.

14. A method of writing data to a memory array, comprising:
storing a first data in first sense amplifiers of a first memory bank of the memory array;
storing a second data in second sense amplifiers of a second memory bank of the memory array;
concurrently alternating programming and verifying the first data in the first memory bank and the second data in the second memory bank, wherein the first and second data are interleaved;
caching in a first data cache configured to cache the first data until commencement of the concurrently alternating programming and verifying of the first data in the first memory bank; and
caching in a second data cache configured to cache the second data until commencement of the concurrently alternating programming and verifying of the second data in the second memory bank.

* * * * *

UNITED STATES PATENT AND TRADEMARK OFFICE
CERTIFICATE OF CORRECTION

PATENT NO. : 7,539,062 B2
APPLICATION NO. : 11/642334
DATED : May 26, 2009
INVENTOR(S) : Daniel H. Doyle It is certified that error appears in the above-identified patent and that said Letters Patent is hereby corrected as shown below:

On the title page, in item (75), in "Inventors", in column 1, line 1, delete "Boise," and insert -- Eagle, --, therefor.

Signed and Sealed this

Eleventh Day of August, 2009

David J. Kappos
*Director of the United States Patent and Trademark Office*